(12) United States Patent
Huang et al.

(10) Patent No.: US 12,254,925 B2
(45) Date of Patent: *Mar. 18, 2025

(54) CONTROL METHOD AND CONTROLLER OF 3D NAND FLASH

(71) Applicant: YANGTZE MEMORY TECHNOLOGIES CO., LTD., Wuhan (CN)

(72) Inventors: Ying Huang, Wuhan (CN); Hongtao Liu, Wuhan (CN); Qiguang Wang, Wuhan (CN); Wenzhe Wei, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/590,207

(22) Filed: Feb. 28, 2024

(65) Prior Publication Data

US 2024/0203497 A1 Jun. 20, 2024

Related U.S. Application Data

(63) Continuation of application No. 17/547,197, filed on Dec. 9, 2021, now Pat. No. 11,948,641, which is a continuation of application No. 16/891,028, filed on Jun. 2, 2020, now Pat. No. 11,250,910, which is a continuation of application No. PCT/CN2020/088769, filed on May 6, 2020.

(51) Int. Cl.
*G11C 16/04* (2006.01)
*G11C 16/10* (2006.01)
*G11C 16/26* (2006.01)
*G11C 16/34* (2006.01)
*G11C 11/56* (2006.01)

(52) U.S. Cl.
CPC .......... *G11C 16/0483* (2013.01); *G11C 16/10* (2013.01); *G11C 16/26* (2013.01); *G11C 16/3459* (2013.01); *G11C 11/5671* (2013.01)

(58) Field of Classification Search
CPC ..... G11C 16/0483; G11C 16/10; G11C 16/26; G11C 16/3459; G11C 11/5671; G11C 2211/5621; G11C 11/5628; G11C 16/3404; G11C 16/3481
USPC ........................................ 365/185.17, 185.24
See application file for complete search history.

(56) References Cited

U.S. PATENT DOCUMENTS

| 5,638,320 A | 6/1997 | Wong et al. |
| 7,251,739 B1 | 7/2007 | Rudelic |

(Continued)

FOREIGN PATENT DOCUMENTS

| CN | 101552037 A | 10/2009 |
| CN | 102132351 A | 7/2011 |

(Continued)

*Primary Examiner* — Michael T Tran
(74) *Attorney, Agent, or Firm* — BAYES PLLC

(57) ABSTRACT

A method of programming a memory device including a cell is provided. A first program pulse is applied to the cell. Middle program pulses are applied to the cell after the application of the first program pulse. A last program pulse is applied to the cell after the application of the middle program pulses. A pulse width of the last program pulse is wider than a pulse width of each of the middle program pulses and the first program pulse.

20 Claims, 4 Drawing Sheets

(56) References Cited

U.S. PATENT DOCUMENTS

| | | |
|---|---|---|
| 7,656,710 B1 | 2/2010 | Wong |
| 8,743,618 B1 | 5/2014 | Kamei |
| 9,082,502 B2 | 7/2015 | Dunga |
| 2003/0235080 A1 | 12/2003 | Yaegashi et al. |
| 2004/0251830 A1 | 12/2004 | Nagao et al. |
| 2005/0024938 A1 | 2/2005 | Ono et al. |
| 2005/0254306 A1 | 11/2005 | Wang |
| 2005/0265073 A1 | 12/2005 | Chae et al. |
| 2005/0270848 A1 | 12/2005 | Chae et al. |
| 2006/0221679 A1 | 10/2006 | Kang et al. |
| 2007/0211536 A1 | 9/2007 | Aritome |
| 2008/0016271 A1 | 1/2008 | Cho et al. |
| 2008/0062751 A1 | 3/2008 | Park et al. |
| 2008/0084751 A1 | 4/2008 | Li et al. |
| 2008/0106930 A1 | 5/2008 | Kim et al. |
| 2009/0046495 A1 | 2/2009 | Shimaoka et al. |
| 2009/0086544 A1* | 4/2009 | Mokhlesi ............... G11C 16/12 365/185.19 |
| 2009/0219740 A1 | 9/2009 | Nagashima et al. |
| 2010/0027326 A1 | 2/2010 | Kim et al. |
| 2010/0097849 A1 | 4/2010 | Hwang et al. |
| 2010/0097855 A1 | 4/2010 | Bayle |
| 2011/0069546 A1 | 3/2011 | Watanabe |
| 2011/0080791 A1 | 4/2011 | Kim et al. |
| 2011/0134701 A1 | 6/2011 | Moschiano et al. |
| 2011/0194346 A1 | 8/2011 | Yoon et al. |
| 2011/0249504 A1 | 10/2011 | Dong et al. |
| 2012/0008384 A1 | 1/2012 | Li et al. |
| 2012/0020154 A1 | 1/2012 | Namiki et al. |
| 2012/0081970 A1 | 4/2012 | Park |
| 2012/0134212 A1 | 5/2012 | Higashi et al. |
| 2012/0213008 A1 | 8/2012 | Choi |
| 2012/0281479 A1 | 11/2012 | Kochar et al. |
| 2012/0287720 A1 | 11/2012 | Choi |
| 2012/0326760 A1 | 12/2012 | Kesselring |
| 2013/0016558 A1 | 1/2013 | Ahn et al. |
| 2013/0088917 A1 | 4/2013 | Park et al. |
| 2013/0208543 A1* | 8/2013 | Park ...................... G11C 16/10 365/185.19 |
| 2013/0250689 A1 | 9/2013 | Lai et al. |
| 2013/0301337 A1 | 11/2013 | Kamalanathan et al. |
| 2014/0019816 A1 | 1/2014 | Hamanaka |
| 2014/0169068 A1 | 6/2014 | Lee |
| 2014/0233308 A1 | 8/2014 | Kim et al. |
| 2014/0301145 A1 | 10/2014 | Sakui |
| 2014/0376310 A1 | 12/2014 | Kim et al. |
| 2015/0198663 A1 | 7/2015 | Syed |
| 2015/0348637 A1 | 12/2015 | Han et al. |
| 2016/0099059 A1 | 4/2016 | Chen et al. |
| 2016/0196876 A1 | 7/2016 | Lee et al. |
| 2016/0203049 A1 | 7/2016 | Kim |
| 2016/0217869 A1 | 7/2016 | Tseng et al. |
| 2016/0240263 A1 | 8/2016 | Kwak et al. |
| 2016/0247567 A1 | 8/2016 | Ikegami et al. |
| 2017/0117055 A1 | 4/2017 | Kim et al. |
| 2017/0140829 A1 | 5/2017 | Park |
| 2018/0211715 A1 | 7/2018 | Cho et al. |
| 2018/0301203 A1* | 10/2018 | Kim ................... G11C 11/5628 |
| 2019/0043563 A1 | 2/2019 | Khakifirooz et al. |
| 2019/0088313 A1 | 3/2019 | Kondo |
| 2019/0164618 A1 | 5/2019 | Yun et al. |
| 2019/0179573 A1 | 6/2019 | Hsu et al. |
| 2019/0348122 A1 | 11/2019 | Ko et al. |
| 2019/0355408 A1 | 11/2019 | Shin et al. |
| 2020/0020396 A1 | 1/2020 | Kanamori et al. |
| 2020/0043559 A1 | 2/2020 | Blodgett et al. |
| 2020/0126625 A1* | 4/2020 | Park ................... G11C 16/3477 |
| 2020/0185047 A1 | 6/2020 | Lee |
| 2020/0211646 A1 | 7/2020 | Cho et al. |
| 2020/0321058 A1 | 10/2020 | Lee et al. |
| 2020/0357476 A1* | 11/2020 | Kim ................... G11C 16/3459 |
| 2020/0395077 A1* | 12/2020 | Lee ................... G11C 16/3459 |
| 2020/0395094 A1* | 12/2020 | Kim ................... G11C 29/023 |
| 2020/0402553 A1 | 12/2020 | Koh et al. |
| 2021/0027702 A1* | 1/2021 | Park .................... G09G 3/3266 |
| 2021/0074215 A1* | 3/2021 | Park .................... G09G 3/3225 |
| 2021/0233445 A1* | 7/2021 | Gao ...................... G09G 3/006 |
| 2021/0327362 A1* | 10/2021 | Park .................... G09G 3/3233 |
| 2022/0114982 A1* | 4/2022 | Tsuchi ................ G09G 3/3688 |

FOREIGN PATENT DOCUMENTS

| | | |
|---|---|---|
| CN | 102576567 A | 7/2012 |
| CN | 104835527 A | 8/2015 |
| CN | 109903799 A | 6/2019 |
| CN | 110619916 A | 12/2019 |
| CN | 110678926 A | 1/2020 |
| EP | 809256 A2 | 11/1997 |
| JP | 2018156714 A | 10/2018 |
| WO | 2015133643 A1 | 9/2015 |

* cited by examiner

CONTROL METHOD AND CONTROLLER OF 3D NAND FLASH

CROSS REFERENCE TO RELATED APPLICATIONS

This application is a continuation of U.S. application Ser. No. 17/547,197, filed on Dec. 9, 2021, issued as U.S. Pat. No. 11,948,641, which is a continuation of U.S. application Ser. No. 16/891,028, filed on Jun. 2, 2020, issued as U.S. Pat. No. 11,250,910, which is a continuation application of International Application No. PCT/CN2020/088769 filed on May 6, 2020, all of which are incorporated herein by reference in their entireties.

BACKGROUND

The present disclosure relates to a control method and controller of 3D NAND flash, and more particularly, to a control method and controller capable of enhancing programming performance for the 3D NAND flash.

Semiconductor memories are widely used in various electronic devices such as cellular phones, digital cameras, personal digital assistants, medical electronic devices, mobile computing devices and non-mobile computing devices. A nonvolatile memory allows information to be stored and retained. Examples of nonvolatile memory include a flash memory (e.g., NAND type and NOR type flash memory) and electrically erasable programmable read only memory (Electrically Erasable Programmable Read-Only Memory, EEPROM).

In the NAND flash, each memory element is configured to store a charge, voltage, or other electrical parameter to represent the data in a plurality of bit-cells (or memory elements), formed from floating-gate transistors. A programming process comprises a plurality of programming voltage pulses in a plurality of programming stages, wherein the voltages of the plurality of programming voltage pulses are increased by the value Vispp, to guarantee the programming is successful. However, with the development in multi-level cell (MLC), triple-level cell (TLC), and quad-level cell (QLC), the requirement of the programming time is more critical than before. That is, the number of programming voltage pulse (so-called pulse count) should be controlled well.

SUMMARY

It is, therefore, a primary objective of the present disclosure to provide a control method and controller of a 3D NAND flash to improve over disadvantages of the prior art.

An embodiment of the present disclosure discloses a control method of a programming process for a three-dimensional (3D) NAND flash memory array comprises programming a bit-cell of the 3D NAND flash memory array in a programming stage; and verifying whether the bit-cell of the 3D NAND flash memory array is programmed in a verification stage after the programming stage; wherein the programming stage comprises programming the bit-cell of the 3D NAND flash memory array with a plurality of programming voltage pulses; wherein the verification stage comprises reading the bit-cell of the 3D NAND flash memory array with a voltage lower or higher than a normal reading voltage pulse.

An embodiment of the present disclosure further discloses a controller for a programming process for a three-dimensional (3D) NAND flash memory array, comprising a storage unit, configured to store a program code; and a processing unit, configured to perform the following steps: programming a bit-cell of the 3D NAND flash memory array in a programming stage; and verifying whether the bit-cell of the 3D NAND flash memory array is programmed in a verification stage after the programming stage; wherein the programming stage comprises programming the bit-cell of the 3D NAND flash memory array with a plurality of programming voltage pulses; wherein the verification stage comprises reading the bit-cell of the 3D NAND flash memory array with a voltage lower or higher than a normal reading voltage pulse.

These and other objectives of the present disclosure will no doubt become obvious to those of ordinary skill in the art after reading the following detailed description of the embodiment that is illustrated in the various figures and drawings.

DETAILED DESCRIPTION

Figure 1:
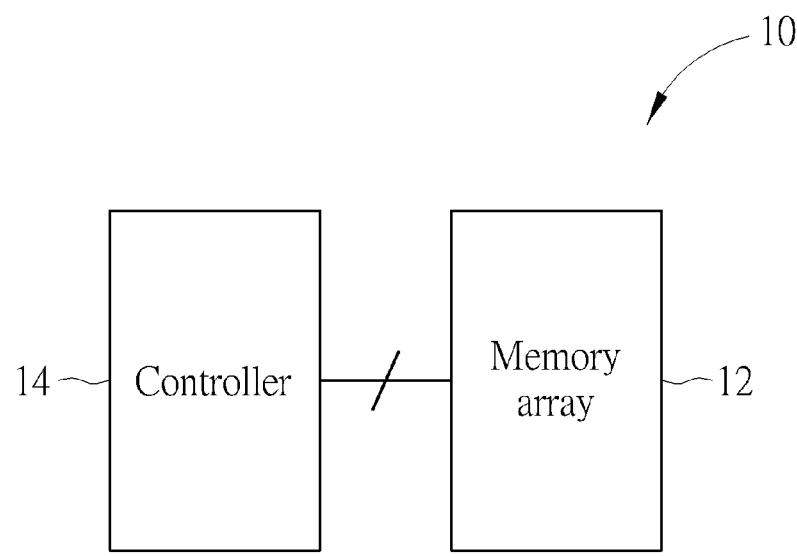
FIG. 1 is a schematic diagram of a memory system.

FIG. 1 is a schematic diagram of a memory system 10. The memory system 10 includes a memory array 12, which is configured to store data in the form of logic 0 or logic 1, and a controller 14, which is configured to receive external commands and to toggle the waveform to control the memory array 12. The bottom select gate line is enabled by the controller 14 toggling the waveforms or receives an external command. In an embodiment, the controller 14 may comprise a processor and a storage unit. The storage unit may store a program code to instruct the processor to perform the function of toggling the waveforms of the present disclosure. In addition, the processor may be a processing unit, an application processor (AP) or a digital signal processor (DSP), wherein the processing unit may be a central processing unit (CPU), a graphics processing unit (GPU) or a tensor processing unit (TPU), and not limited thereto. The storage unit may be a memory, which may be a non-volatile memory, such as an electrically erasable programmable read-only memory (EEPROM) or a flash memory, and not limited thereto.

Three-dimensional (3D) NAND flash includes a memory array, which includes many pages of memory elements. Each memory element is configured to store a charge, voltage, or other electrical parameters to represent the data. However, with the increasing number of cells in each page, the programming time is increasing, too. A programming (or other equivalents) operation that is being processed at non-volatile memory (NVM) may be programmed by a plurality of programming voltage pulses in a plurality of programming stages, wherein the voltages of the plurality of programming voltage pulses are increased by the value Vispp, to guarantee the programming is successful.

More specifically, in the programming stage, the bit-cell is conducted, if the bit-cell is not "strong" enough, or the voltage of the charge-trapping line does not meet the threshold equivalently, then the bit-cell may turn to logic 0 from logic 1 during aging, and the reliability of 3D NAND flash is degraded. Therefore, a verification is required to examine whether the bit-cell is a "strong" logic 1 or "weak" logic 1 by measuring the voltage of a charge-trapping line.

Figure 2:
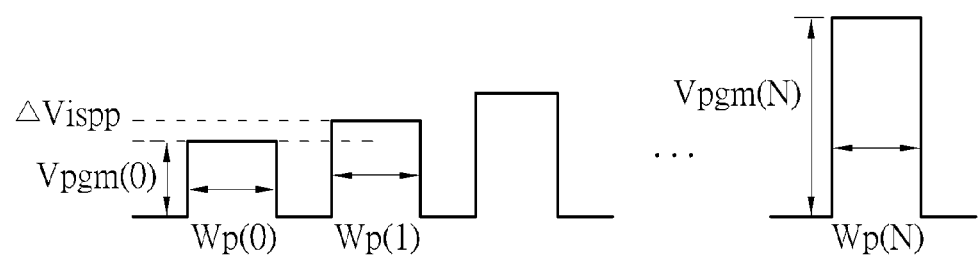
FIG. 2 is a schematic diagram of waveforms of a programming process for a bit-cell of a 3D NAND flash memory array in the prior art.

FIG. 2 is a schematic diagram of waveforms of a programming process for a bit-cell of a 3D NAND flash memory array in the prior art. As can be seen, the plurality of the programming voltage pulses is in the same pulse width, wherein the voltages in these pulses are increased by the value Vispp. This is because the bit-cell will be programed in a certain threshold voltage; that is, the bit-cell will be programmed until the programming voltage is greater than the threshold voltage with the constant pulse width. Finally, a verification stage is required to verify whether the programming is successful or not. In other words, the number of the programming voltage pulse (pulse count) in the programming stage is variant in each bit-cell. Therefore, the programming time will be varied accordingly.

In other words, the program operation may be performed using incremental pulses which incrementally increase the voltage level of each pulse, which in turn increases the voltage level stored at the bit-cell. However, with the development in multi-level cell (MLC), triple-level cell (TLC), and quad-level cell (QLC), the requirement of the programming time is more critical than before. In other word, the number of programming voltage pulses should be controlled well.

For example, the bit-cell of the 3D NAND flash memory array cannot serve other requests during the programming voltage pulse; that is, the larger pulse counts, the shorter idle time which can serve other requests. In other words, the read latency will be increased as the number of pulse count increases.

Different from the prior art, a control method of the present disclosure performs the programming process for the bit-cell of the 3D NAND flash memory array by adjusting the voltages of the plurality of the programming voltage pulses and the pulse widths of the plurality of the programming voltage pulses in the programming stage. Thereby, the programming time of the bit-cell of the 3D NAND flash memory array may be shortened.

Figure 3A:
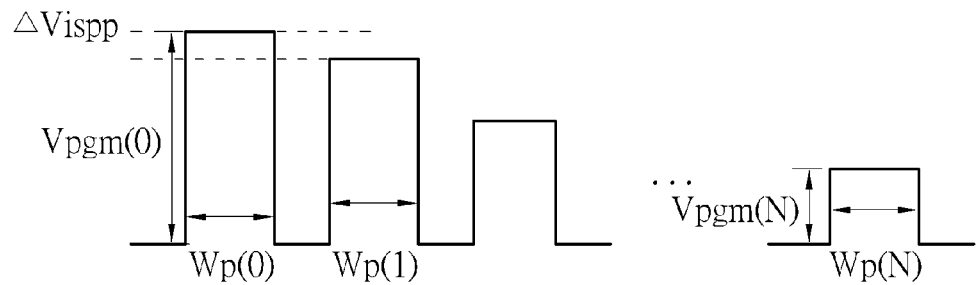
FIGS. 3A and 3B are schematic diagrams of waveforms of a programming process for a bit-cell of a 3D NAND flash memory array according to embodiments of the present disclosure.

For example, FIG. 3A is a schematic diagram of waveforms of a programming process for a bit-cell of a 3D NAND flash memory array according to an embodiment of the present disclosure. As shown in FIG. 3A, the pulse width of each programming voltage pulse is the same as that in the prior art, where the difference is the order of the plurality of programming voltage pulses. In other words, the voltage of plurality of programming voltage pulses in the embodiment of the present disclosure are increased, as mentioned above; in the prior art, however, the voltages of the plurality of the plurality of programming voltage pulses are decreased.

More specifically, the voltages of the plurality of the plurality of programming voltage pulses are decreased by Vispp, which is the same quantity as the incremental quantity in the prior art. For example, if the programming voltage pulse count is three, and the maximum programming voltage pulse is Vpgm+7Vispp, then the voltages of programming voltage pulses are Vpgm, Vpgm+Vispp, Vpgm+2Vispp in the prior art. However, the voltages of programming voltage pulses are Vpgm+7Vispp, Vpgm+6Vispp, Vpgm+5Vispp in the embodiment of the present disclosure. Therefore, the power input to the bit-cell of the present disclosure is greater than the power of the prior art, so as to make the programming voltage pulse count to be less in comparison to the prior art.

Figure 3B:
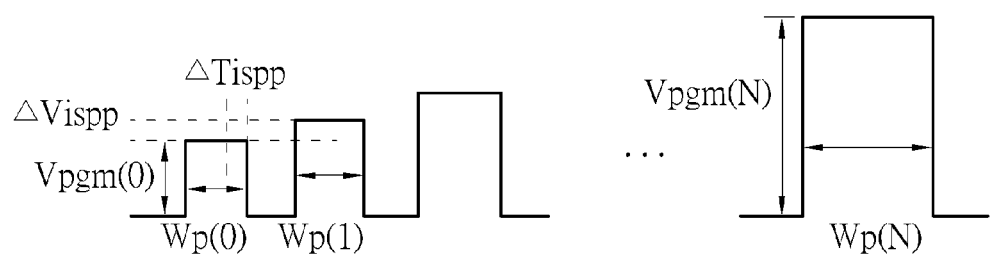

FIG. 3B is a schematic diagram of waveforms of a programming process for a bit-cell of a 3D NAND flash memory array according to an embodiment of the present disclosure. As can be seen, the pulse widths of the plurality of the plurality of programming voltage pulses are increased by Tispp. For example, the first three pulse widths of the programming voltage pulses are Tpgm, Tpgm+Tispp, Tpgm+2Tispp. Similarly, the programming time may be reduced because it may save the ramping time for power amplifier to each programming voltage pulse.

Notably, the reading window margin would be reduced if pulse width is increased, and the 3D NAND flash memory array may not rapidly respond to the read request so that the read latency may be increased. Therefore, those skilled in the art may make the balance of performance between programming and reading.

More specifically, the distribution width of the threshold voltage Vt in the high state is narrower because the distribution of Vt in the high programming state is required to be more convergent. In other words, the pulse width of the higher voltage of the programming voltage pulse may be less than the pulse width of the lower voltage of the programming voltage pulse due to the process of the 3D NAND flash.

Figure 4:
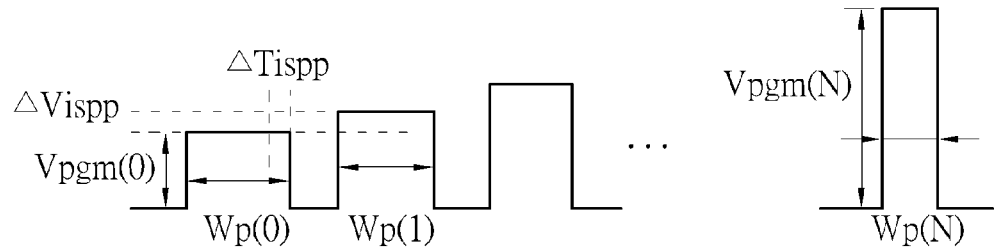
FIG. 4 is a schematic diagram of waveforms of a programming process for a bit-cell of a 3D NAND flash memory array according to an embodiment of the present disclosure.

For example, the advantages of the methods illustrated in FIG. 3A and FIG. 3B may be combined. Please refer to FIG. 4, which is a schematic diagram of waveforms of a programming process for a bit-cell of a 3D NAND flash memory array according to an embodiment of the present disclosure. As shown in FIG. 4, the voltages of the plurality of programming voltage pulses are decreased by Vispp, and the pulse widths of the plurality of programming voltage pulses are decreased by Tispp.

Figure 5:
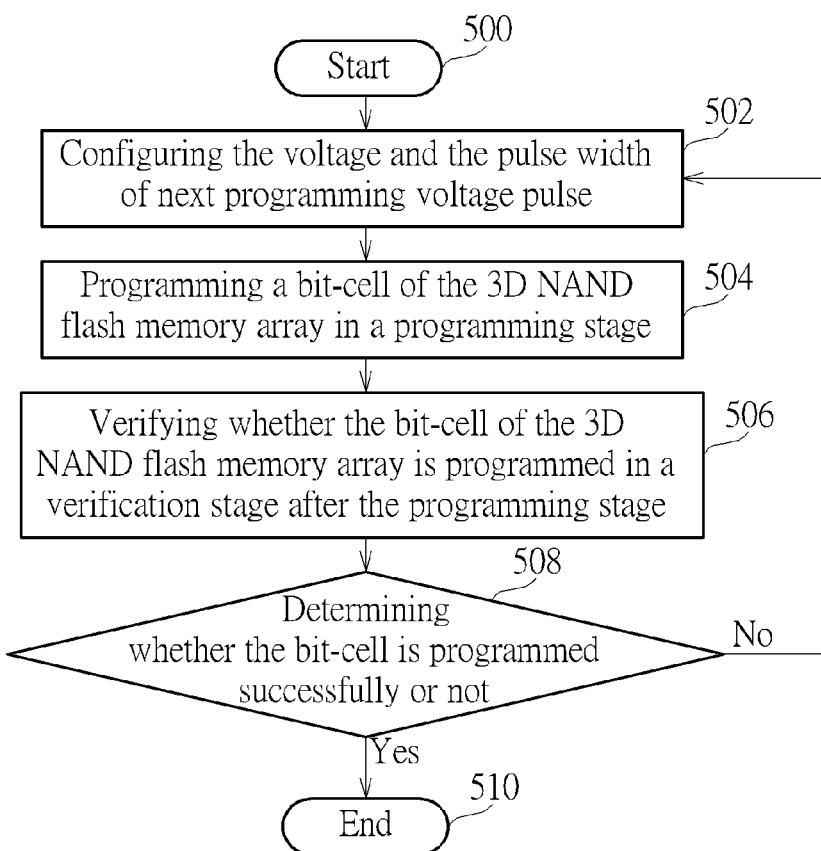
FIG. 5 is a schematic diagram of a programming process for a memory system according to an embodiment of the present disclosure.

The operation of the programming process of the present disclosure may be summarized to a programming process 50, as shown in FIG. 5. The programming process 50 comprises the following steps:

Step 500: Start.

Step 502: Configuring the voltage and the pulse width of next programming voltage pulse.

Step 504: Programming a bit-cell of the 3D NAND flash memory array in a programming stage.

Step 506: Verifying whether the bit-cell of the 3D NAND flash memory array is programmed in a verification stage after the programming stage.

Step 508: Determining whether the bit-cell is programmed successfully or not, if yes, go to Step 510; if no, go to Step 502.

Step 510: End.

In Step 502, the initial voltage of the plurality of voltage pulse and the initial pulse width may be adjustable according to different utilization scenarios. In an embodiment, the voltage of the programming voltage pulse and the pulse width may be a fixed value by pre-determining, calibration, determined by a mapping table, or adjusted accordingly to fit the practical scenario, which are corresponding to the voltage, the current, the temperature, the age or their combination thereof. Those skilled in the art may make modifications of the decision rule and alterations accordingly, and not limited herein.

Figure 6:
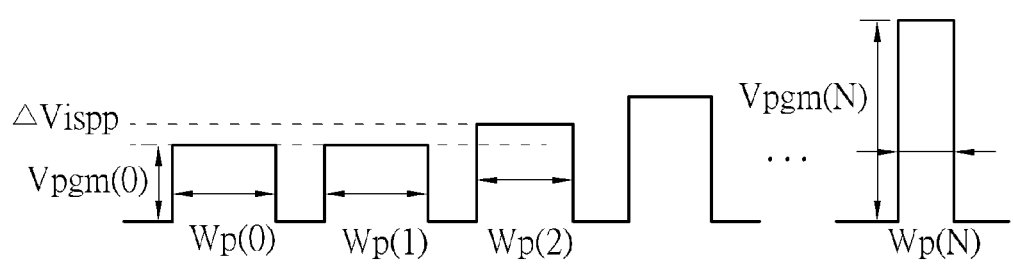
FIG. 6 is a schematic diagram of waveforms of a programming process for a bit-cell of a 3D NAND flash memory array according to an embodiment of the present disclosure.

In addition, in Step 502, the plurality of voltages and the pulse widths of the plurality of the programming voltage pulses may be decremental instead of being incremental. For example, FIG. 6 is a schematic diagram of waveforms of a programming process for a bit-cell of a 3D NAND flash memory array according to an embodiment of the present disclosure. As shown in FIG. 6, the first three voltages of the programming voltage pulses are Vpgm, Vpgm, Vpgm+Vispp. Similarly, the plurality of voltages and the pulse widths of the plurality of the programming voltage pulses may be partially decremental.

In Step 504, the programming process 50 may be modified to have a verification stage to follow a plurality of programming stages in sequence. For example, in an embodiment, the programming process 50 may comprise a first programming stage and a second programming stage, followed by a verification stage.

In Step 506, the controller 14 may read the memory in the stress criteria; that is, the controller 14 may read the data from the bit-cell of the 3D NAND flash memory array with a voltage lower or higher than normal reading voltage pulse in the verification stage. As can be seen, if the data in the bit-cell is stored by the high resistance, then the controller may use the lower voltage to read to guarantee the data in the bit-cell is with the resistance high enough, and vice versa, which is not narrated herein for brevity. For example, if the normal reading voltage is 3.3V, i.e., the 3D NAND flash memory operates for reading at 3.3V, then the verification voltage in the present disclosure may be 2V, which is lower than 3.3V, or 5V, which is higher than 3.3V, to read the 3D NAND flash memory to guarantee the data in the bit-cell is with the resistance high (or low) enough.

In addition, the voltage of each programming voltage pulse may not be a multiple of Vispp. For example, the first three voltages of the programming voltage pulses may be Vpgm, Vpgm+0.2, Vpgm+0.6, Vpgm+0.9 (volt), . . . . That is, the voltages of the plurality of the programming voltage pulses may be adjusted, and the pulse widths of the plurality of the programming voltage pulses are similar thereto.

The detailed operation of the programming progress 50 may be referred to the foregoing description, which is not narrated herein for brevity.

Practically, if the verification stage (Step 506) of the programming process 50 is failed because the controller 14 determines that the logic 1 of a bit-cell is not strong enough, then the controller 14 may repeat the programming process 50 to guarantee that the bit-cell is accurately programmed. Moreover, if the verification stage (Step 506) is failed too many times, then the programming process 50 may be regarded as failed and the controller 14 may output an error message to the external system. The criteria to determine the failure of the programming process 50 is not limited, and may be based on a threshold time, a threshold number of performing erasing and verification process for the 3D NAND flash, or any combination thereof. Those skilled in the art may make modifications of the decision rule and alterations accordingly, and not limited herein.

In an embodiment, the 3D NAND flash memory array may comprise a top select gate line, a bottom select gate line, a charge-trapping line, a common-source line, and a p-well line. In the programming stage, the programming waveform is inputted to store data in the form of logic 0 or logic 1. However, the interface of the bit-cell of the 3D NAND flash memory array is not limited hereinabove, and those skilled in the art may make modifications and alterations according to the 3D NAND flash memory array in the whole system.

Notably, the embodiments stated in the above are utilized for illustrating the concept of the present disclosure. Those skilled in the art may make modifications and alterations accordingly, and not limited herein. Hence, as long as the voltages of the plurality of the programming voltage pulses and the pulse widths of the plurality of the programming voltage pulses in the programming stage may be adjusted or programmable, the requirement of the present application is satisfied.

In summary, by adjusting the voltages of the plurality of the programming voltage pulses and the pulse widths of the plurality of the programming voltage pulses in the programming stage, the method and controller of the 3D NAND flash in the present application have advantages of reducing the programming voltage pulse counts in the programming process, which may reduce the programming time for the bit-cell of a 3D NAND flash memory array, so as to enhance programming performance.

Those skilled in the art will readily observe that numerous modifications and alterations of the device and method may be made while retaining the teachings of the present disclosure. Accordingly, the above disclosure should be construed as limited only by the metes and bounds of the appended claims.

What is claimed is:

1. A method of programing a memory device comprising a cell, the method comprising:
applying a first program pulse to the cell;
applying middle program pulses to the cell after the application of the first program pulse, comprising applying a first middle program pulse to the cell, a pulse width of the first middle program pulse being wider than a pulse width of the first program pulse; and
applying a last program pulse to the cell after the application of the middle program pulses, wherein a pulse width of the last program pulse is wider than a pulse width of each of the middle program pulses and the first program pulse.

2. The method of claim 1, wherein the pulse width of each of the middle program pulses is the same.

3. The method of claim 1, wherein applying the middle program pulses to the cell further comprises:
applying a second middle program pulse to the cell, the pulse width of the first middle program pulse being the same as a pulse width of the second middle program pulse.

4. The method of claim 1, wherein applying the middle program pulses to the cell further comprises:
applying a second middle program pulse to the cell, a pulse width of the second middle program pulse being the same as the pulse width of the first program pulse.

5. The method of claim 1, wherein applying the middle program pulses to the cell comprises:
applying first part middle program pulses to the cell;
applying second part middle program pulses to the cell after the application of the first part middle program pulses; and
applying third part middle program pulses to the cell after the application of the second part middle program pulses.

6. The method of claim 5, wherein
a pulse width of each of the first part middle program pulses is the same; and
a pulse width of each of the third part middle program pulses is the same.

7. The method of claim 5, wherein
a pulse width of each of the first part middle program pulses is wider than a pulse width of each the second middle program pulses; and
a pulse width of each of the third part middle program pulses is wider than a pulse width of each the second middle program pulses.

8. The method of claim 5, wherein a pulse width of the first part middle program pulses is wider than the pulse width of the first program pulse.

9. The method of claim 5, wherein the pulse width of the first program pulse is wider than a pulse width of the first part middle program pulses.

10. The method of claim 5, wherein
a pulse width of each of the first part middle program pulses and the first program pulse is the same; and
a pulse width of each of the first part middle program pulses is wider than a pulse width of each the second middle program pulses.

11. A memory device, comprising:
a memory array comprising a cell; and
a controller coupled to the memory array and configured to:
apply a first program pulse to the cell;
apply middle program pulses to the cell after the application of the first program pulse, wherein the middle program pulses comprises a first middle program pulse having a pulse width wider than a pulse width of the first program pulse; and
apply a last program pulse to the cell after the application of the middle program pulses,
wherein a pulse width of the last program pulse is wider than a pulse width of each of the middle program pulses and the first program pulse.

12. The memory device of claim 11, wherein the pulse width of each of the middle program pulses is the same.

13. The memory device of claim 11, wherein to apply the middle program pulses to the cell, the controller is further configured to:
apply a second middle program pulse to the cell, the pulse width of the first middle program pulse being the same as a pulse width of the second middle program pulse.

14. The memory device of claim 11, wherein to apply the middle program pulses to the cell, the controller is configured to:
apply a second middle program pulse to the cell, a pulse width of the second middle program pulse being the same as the pulse width of the first program pulse.

15. The memory device of claim 11, wherein to apply the middle program pulses to the cell, the controller is configured to:
apply first part middle program pulses to the cell;
apply second part middle program pulses to the cell after the application of the first part middle program pulses; and
apply third part middle program pulses to the cell after the application of the second part middle program pulses.

16. The memory device of claim 15, wherein
a pulse width of each of the first part middle program pulses is the same; and
a pulse width of each of the third part middle program pulses is the same.

17. The memory device of claim 15, wherein
a pulse width of each of the first part middle program pulses is wider than a pulse width of each the second middle program pulses; and
a pulse width of each of the third part middle program pulses is wider than a pulse width of each the second middle program pulses.

18. The memory device of claim 15, wherein a pulse width of the first part middle program pulses is wider than the pulse width of the first program pulse.

19. The method of claim 1, wherein a programming voltage of each of the middle program pulses is adjusted based on at least one of a voltage, a current, a temperature, or an age associated with the memory device.

20. The memory device of claim 11, wherein a programming voltage of each of the middle program pulses is adjusted based on at least one of a voltage, a current, a temperature, or an age associated with the memory array.

\* \* \* \* \*